United States Patent
Kienzler et al.

(10) Patent No.: US 7,183,695 B2
(45) Date of Patent: Feb. 27, 2007

(54) PIEZOELECTRIC ACTUATOR MODULE, AND METHOD FOR ASSEMBLING A PIEZOELECTRIC ACTUATOR MODULE

(75) Inventors: Dieter Kienzler, Leonberg (DE); Dietmar Uhlmann, Korb (DE); Jean-Luc Loutrage, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 169 days.

(21) Appl. No.: 10/509,590

(22) PCT Filed: Jun. 6, 2003

(86) PCT No.: PCT/DE03/01885

§ 371 (c)(1),
(2), (4) Date: Sep. 29, 2004

(87) PCT Pub. No.: WO2004/016939

PCT Pub. Date: Feb. 26, 2004

(65) Prior Publication Data

US 2005/0162046 A1    Jul. 28, 2005

(30) Foreign Application Priority Data

Jul. 20, 2002    (DE) ............................. 102 33 100

(51) Int. Cl.
*H01L 41/083* (2006.01)
*H01L 41/053* (2006.01)
*B05B 1/08* (2006.01)

(52) U.S. Cl. .............. 310/328; 310/348; 239/102.2; 251/129.06; 123/446

(58) Field of Classification Search ............... 310/328, 310/348; 123/445, 446; 251/129.06; 239/102.2
See application file for complete search history.

(56) References Cited

U.S. PATENT DOCUMENTS

| | | | | | |
|---|---|---|---|---|---|
| 4,474,326 | A | * | 10/1984 | Takahashi ............... 239/102.2 |
| 5,272,797 | A | * | 12/1993 | Miyoshi .................. 29/25.35 |
| 5,875,764 | A | * | 3/1999 | Kappel et al. ............. 123/467 |
| 6,705,587 | B1 | * | 3/2004 | Frank et al. ........... 251/129.06 |
| 2003/0164405 | A1 | * | 9/2003 | Kienzler et al. ......... 239/102.2 |
| 2006/0033062 | A1 | * | 2/2006 | Ruthardt et al. ....... 251/129.06 |

FOREIGN PATENT DOCUMENTS

| | | | |
|---|---|---|---|
| DE | 19909106 | * | 9/2000 |
| DE | 10016247 | * | 10/2001 |
| JP | 3-258966 | * | 11/1991 ............ 123/179.16 |

* cited by examiner

Primary Examiner—Thomas M. Dougherty
(74) Attorney, Agent, or Firm—Ronald E. Greigg

(57) ABSTRACT

A piezoelectric actuator module having at least one piezoelectric component, one actuator foot, and one actuator head is surrounded by an axially extending bush. For sealing the piezoelectric actuator module in the axial direction, the actuator foot is adjoined by a diaphragm, which extends essentially in the radial direction, is joined to the bush, and has a cross section with various radii of curvature.

20 Claims, 5 Drawing Sheets

PIEZOELECTRIC ACTUATOR MODULE, AND METHOD FOR ASSEMBLING A PIEZOELECTRIC ACTUATOR MODULE

CROSS-REFERENCE TO RELATED APPLICATIONS

This application is a 35 USC 371 application of PCT/DE 03/01885 filed on Jun. 6, 2003.

BACKGROUND OF THE INVENTION

1. Field of the Invention

The invention is based on a piezoelectric actuator module, in particular for an injector in the high-pressure portion of an injection system having the "common rail" type of injection system in a motor vehicle and on a method for installing an actuator module.

2. Description of the Prior Art

One actuator module known in the industry can be used in particular in conjunction with common rail injection systems for Diesel engines. The piezoelectric actuator module is assigned a valvelike valve control module and is used to actuate a valve closing member of the valve control module. By means of the valve control module, a nozzle needle of a nozzle module of the injection valve is actuatable in turn. The nozzle needle cooperates with at least one injection opening leading to a combustion chamber of the engine.

The piezoelectric actuator module typically includes an actuator foot, which is braced on a housing of the injection valve; a piezoelectric component, which when an electrical voltage is applied undergoes elongation; and an actuator head, by way of which the elongation of the piezoelectric component is transmitted to a so-called adjusting piston in such a way that this piston is displaced axially. The adjusting piston, via a hydraulic coupler embodied as a hydraulic chamber, cooperates with a so-called actuating piston, which in turn communicates with the valve closing member. A construction of this kind is also described in German Patent Disclosure DE 199 46 831.

German Patent Disclosure DE 100 43 626 shows a piezoelectric actuator module which is surrounded by an axially extending bush that serves to protect the piezoelectric component against dirt and fuel as well as against damage in the installation process. In the region of the actuator head, the piezoelectric actuator module is sealed by means of a bellows, which on the one hand permits an actuator stroke to occur and on the other can compensate for a negative coefficient of thermal expansion on the part of the piezoelectric component. However, bellows have the disadvantages of requiring a relatively large amount of space and of being cost-intensive components.

SUMMARY AND ADVANTAGES OF THE INVENTION

The piezoelectric actuator module according to the invention in which the actuator foot is adjoined by a diaphragm which extends essentially in the radial direction, is joined to the bush, and has a cross section with various radii of curvature, has the advantage over the prior art that the diaphragm is extraordinarily low in height and therefore requires only little space. Furthermore, the costs for the diaphragm are markedly less than those for a bellows.

The diaphragm of the piezoelectric actuator module of the invention is preferably designed such that it can follow along with a displacement of the actuator head of 40 μm, for instance, that is brought about by an elongation of the piezoelectric component. If the diaphragm seals off the actuator module in the axial direction, then together with the bush that radially defines the actuator module, it forms a protective sheathing of the actuator module. Hence all the components, comprising the actuator foot, the piezoelectric component, the actuator head, the bush, and the diaphragm, thus form a kind of piezoelectric actuator cartridge.

Thus the diaphragm has the following functions: a sealing function; a temperature equalization function between the piezoelectric component with negative elongation and the bush with positive elongation upon heating; and the function of transmitting the actuator stroke (connection of the actuator head and the bush).

In an advantageous embodiment, the diaphragm may be made from a spring steel, for instance, or a precipitation-hardening material.

An especially secure connection of the diaphragm to the actuator foot can be attained if these two components are welded to one another.

Moreover, the diaphragm may be welded to the bush or made integrally with the bush. In both cases, the diaphragm advantageously has a central opening for a tapered portion of the actuator foot, for transmitting the elongation of the piezoelectric component to the at least one piston. In that case, the diaphragm is embodied annularly.

In a preferred embodiment of the piezoelectric actuator module of the invention, the diaphragm, which is embodied annularly, has a curved cross section. The mechanical loads acting on the diaphragm in operation are at their least in this embodiment.

It proves especially advantageous with respect to the available installation space and the loads prevailing in operation of the actuator module to use a diaphragm which has a cross section with various radii of curvature. The cross section of such a diaphragm is embodied in plane fashion in the region of the connection with the actuator foot, for instance, so that in this region the diaphragm is embodied conically; the conical region is then adjoined first by a region having a first radius of curvature, and the region with the first radius of curvature is adjoined by a region with a second radius of curvature, which is less than the first radius of curvature, and the region with the second radius of curvature is adjoined by a region with a third radius of curvature, which is still less in turn than the second radius of curvature. The region with the third radius of curvature can in turn be adjoined by a cylindrical region oriented parallel to the bush, and by way of that region the diaphragm is then joined to the bush. The angle between the conical region and the cylindrical region of the diaphragm is 45°, for instance. For an outer diameter of the annular diaphragm of 9.85 mm, for instance, and an inner diameter of the annular diaphragm of 3.7 mm, for instance, the first radius of curvature is 1.9 mm, the second radius of curvature is 1.5 mm, and the third radius of curvature is 1.0 mm. This kind of diaphragm shape is the result of an FEM optimization, for a given amount of installation space. This diaphragm shape, with a diaphragm thickness of 80 μm, for instance, makes it possible to absorb the loads that occur in operation of the actuator module, loads that comprise in particular the fluid pressure of a maximum of 60 bar exerted on the diaphragm, temperature fluctuations between −40° C. and 160° C., and an actuator stroke of approximately 35 μm. Joining the diaphragm to the actuator head or to the bush is expediently done via laser-welded seams.

However, in a variant embodiment, the diaphragm may also have an essentially plane shaping.

The thickness of the diaphragm, in an advantageous embodiment, ranges for instance between 70 μm and 0.2 mm.

The invention also has a method for installing a piezoelectric actuator module as its subject; this actuator module includes at least one piezoelectric component, one actuator foot and one actuator head, which head cooperates with a component to be actuated by the piezoelectric component; the actuator module is surrounded by an axially extending bush. According to the invention, the bush, on the side of the actuator foot, is closed off on its face end by means of a diaphragm that extends essentially in the radial direction.

Expediently, upon closure of the bush, the diaphragm is welded in load-free fashion to the actuator head. Then the diaphragm can be introduced, together with the actuator head, into the bush, and the piezoelectric component can be subjected to a preload. For an actuator rigidity of 40 N/μm, a preload of 750 N corresponds to a travel of approximately 19 μm. The diaphragm itself remains load-free here. Next, with the piezoelectric component loaded, the diaphragm is welded to the bush, whereupon the preload is taken away by the actuator head, causing a deflection of the diaphragm by 19 μm in the direction of the actuator foot. In this kind of installation method, because of the 750 N preload that acts on the bush, the positive deflection of the diaphragm is compensated for. Then, with the piezoelectric component unactuated and without fluid pressure acting on the diaphragm, and at a temperature of 20° C., for instance, the diaphragm is in its zero position and is load-free.

BRIEF DESCRIPTION OF THE DRAWINGS

Further advantages and advantageous refinements of the invention will become apparent from the description, contained herein below, taken in conjunction with the drawings, in which.

DESCRIPTION OF THE PREFERRED EMBODIMENTS

Figure 1:
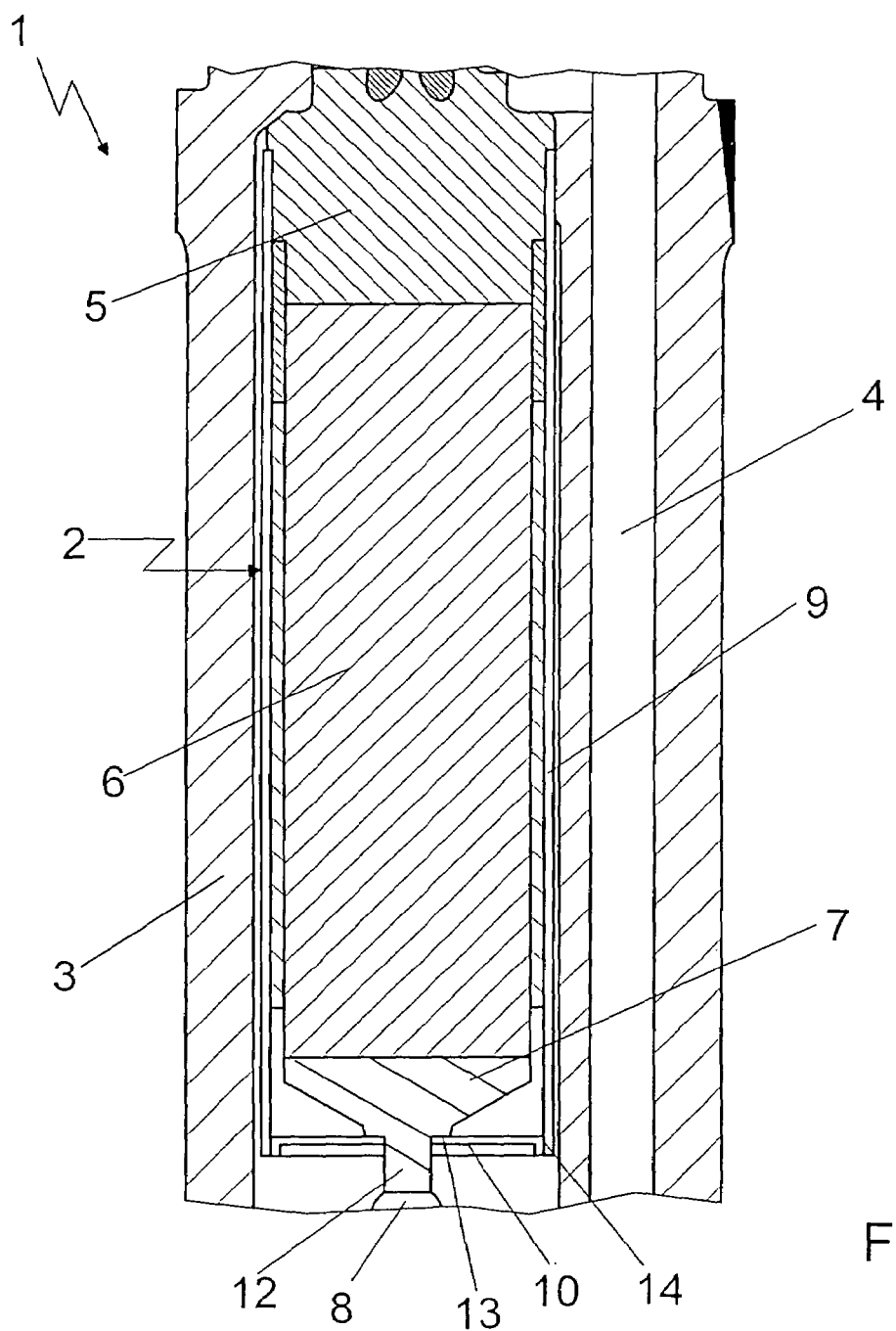
FIG. 1 is a simplified longitudinal section of a piezoelectric actuator module which serves as a triggering unit of an injection valve.
Figure 2:
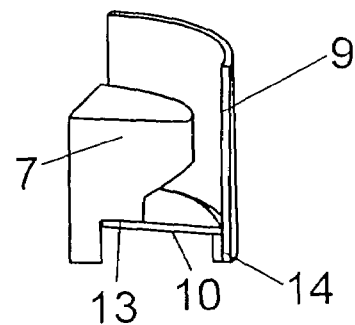
FIG. 2, a perspective view of a detail of a region of the actuator foot of the actuator module of FIG. 1.

The exemplary embodiment shown in FIGS. 1 and 2 shows a portion of a fuel injection system 1 which is intended to be built into an internal combustion engine of a motor vehicle and is embodied here as a common-rail injector, preferably for injecting Diesel fuel.

The injector includes an actuator module 2, which is accommodated in a holder body 3 and, via a coupler module, is associated with a valvelike valve control module that serves to actuate a nozzle needle that is disposed in a nozzle module not shown here in further detail. Also embodied in the holder body 3 is a fuel supply conduit 4 (high-pressure bore) extending parallel to the actuator module 2 and serving to carry fuel from a common-rail injector to the nozzle module of the injection valve 1.

The actuator module 2 includes a so-called actuator foot 5, by way of which the actuator module 2 is braced on the holder body 3; a piezoelectric component 6, adjoining the actuator foot 5 in the axial direction, which is made in the usual way from a plurality of layers of a piezoelectric material; and a so-called actuator head 7, adjoining the piezoelectric component 6 in the direction remote from the actuator foot 5. The actuator head 7 serves to transmit an elongation or contraction of the piezoelectric component 6 to an adjusting piston, known per se and not shown here, of the valve control unit, which unit is in principle preferably constructed like a valve for controlling fluids as described in DE 199 46 831.

Thus the adjusting piston can be operatively connected in the usual way, via a hydraulic coupler (coupler module) embodied as a hydraulic chamber, with a so-called actuating piston, and the lower actuating piston in turn is preferably joined to a valve closing member that cooperates with a valve seat.

Transmitting the elongation of the piezoelectric component 6 is effected via a ball 8 serving here as a compensation element. The ball 8 has a diameter of approximately 3 mm, for instance.

The piezoelectric actuator module 2 is surrounded here by an axially extending, essentially cylindrical, thin-walled bush 9, which is made for instance from economical stainless steel and which radially seals the actuator module 2.

On the side remote from the actuator foot 5, the piezoelectric actuator module 2 is sealed off in the axial direction by means of a diaphragm 10, in this case formed of spring steel, that extends essentially in the radial direction, is embodied annularly, and has a central opening for a peglike region 12 of the actuator head 7.

For example, the diaphragm may have a thickness of 0.08 mm to 0.2 mm, an outer diameter of 9.5 mm, and an inner diameter of 2.5 mm.

The diaphragm 10, whose shaping here is essentially plane or platelike, is solidly joined, on its inner boundary oriented toward the peglike region 12, to the actuator head 7 via a weld seam 13. At the outer boundary, which is oriented toward the bush 9, the diaphragm 10 is joined to the bush 9 via a weld seam 14.

Figure 3:
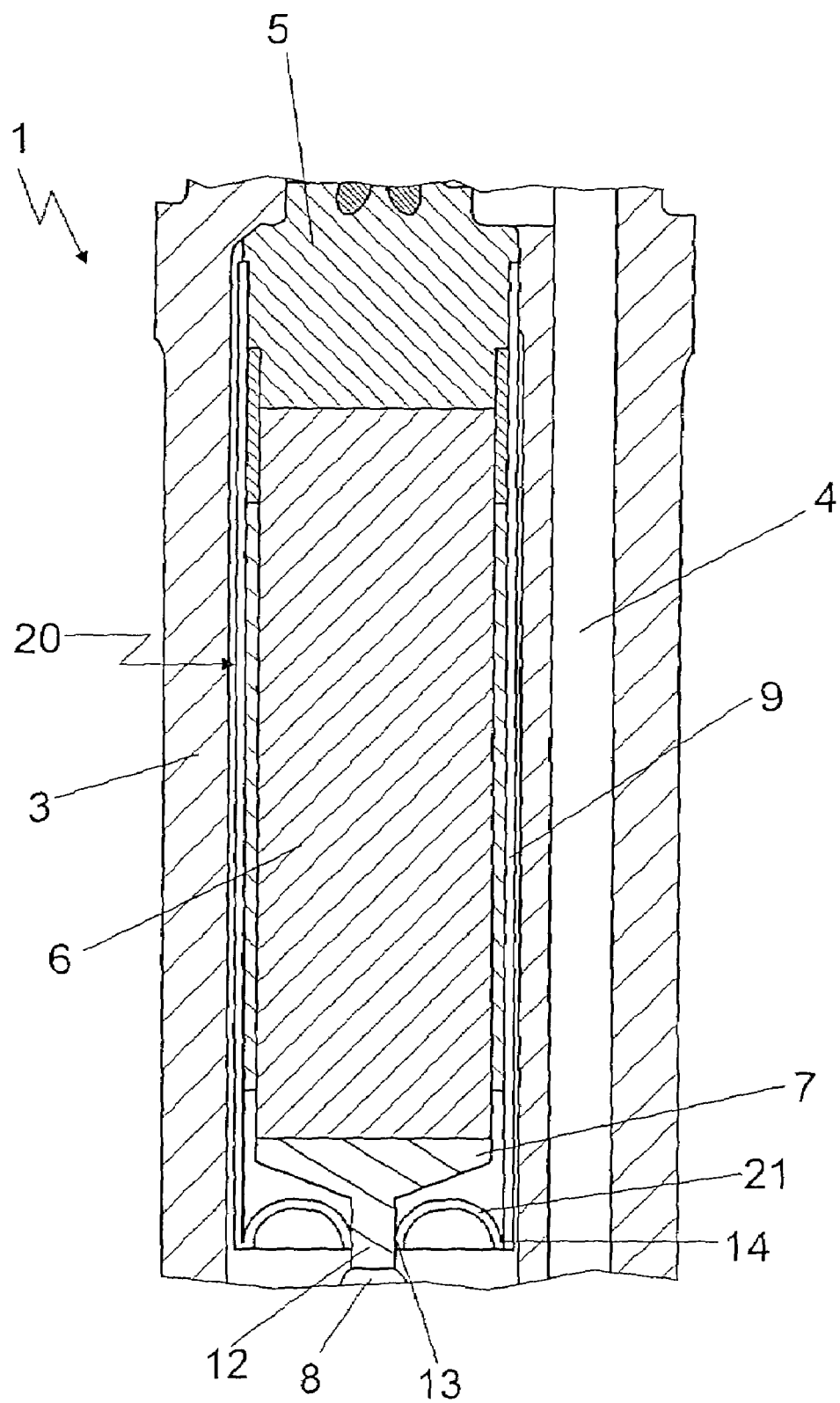
FIG. 3, a second embodiment of a piezoelectric actuator module in an injection valve, in a view corresponding to FIG. 1.

In FIG. 3, an alternative embodiment of a piezoelectric actuator module 20 is shown. This embodiment differs from that of FIGS. 1 and 2 by a diaphragm 21 which is curved in elliptical to circular form, in which the curvature extends in the direction of the piezoelectric component 6. The diaphragm 21, which extends essentially in the radial direction, is again embodied annularly, and it is joined on its inner boundary to the actuator head 7 via a weld seam 13 and on the outer boundary via a weld seam 14 to the bush 9. In this embodiment, the mechanical loads that act on the diaphragm in operation are only slight.

Figure 4:
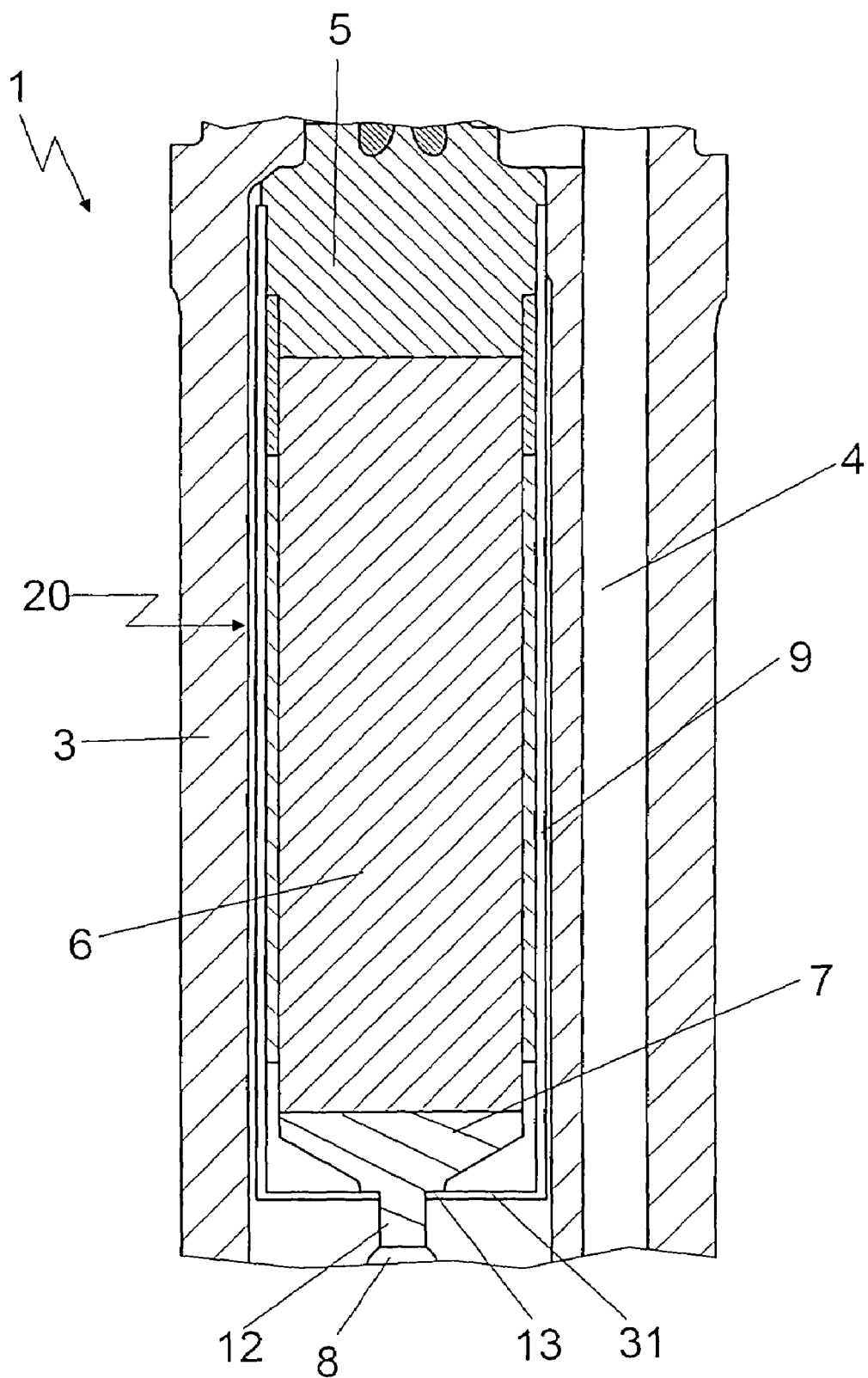
FIG. 4, a third embodiment of a piezoelectric actuator module in longitudinal section.

In FIG. 4, a third embodiment of a piezoelectric actuator module 30 of the invention is shown. This embodiment differs from that of FIGS. 1 and 2 in that it has a diaphragm 31 which is made integrally with the bush 9 and thus forms a unit with the bush 9. The diaphragm 31, which has a flat or plane geometry, is embodied annularly and is joined on its inner boundary to the actuator head 7 via a weld seam 13.

It is understood that the invention is not limited to the embodiments shown. On the contrary, the diaphragm may also have all other conceivable shapes that one skilled in the art considers suitable for a given application.

Figure 5:
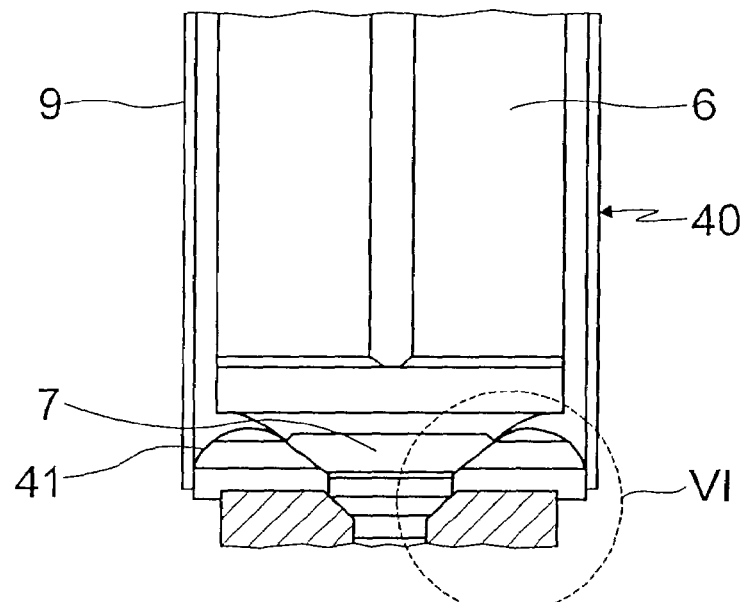
FIG. 5, a fourth embodiment of a piezoelectric actuator module in longitudinal section.

In FIG. 5, a fourth embodiment of a piezoelectric actuator module 40 of the invention is shown. The structure of the actuator module 40 differs from that of the actuator module of FIG. 1 in that it has a diaphragm 41 which has a cross section with various radii of curvature, and the annular diaphragm 41 is embodied as curved in the direction of the piezoelectric component 6.

Figure 6:
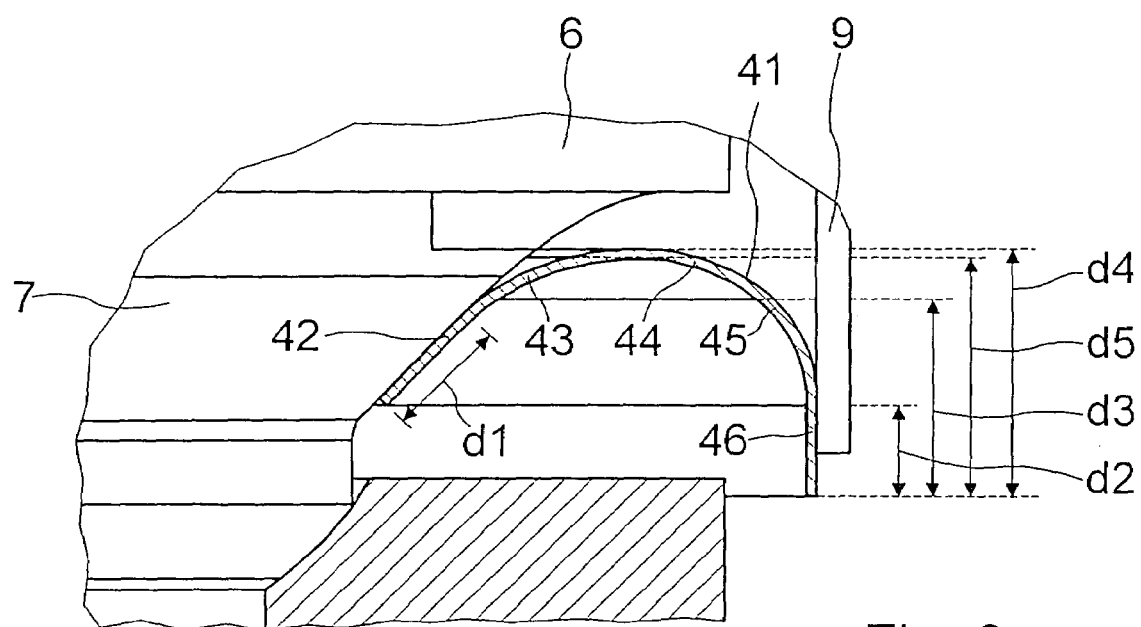
FIG. 6, an enlarged view of the region VI outlined in dashed lines in FIG. 5.

The cross section of the diaphragm 41, which is shown enlarged in FIG. 6, has a conically embodied region 42 of plane cross section, which forms an angle of 45° with the bush 9 and has a length d1 of 0.7 mm. The diaphragm 41 is welded to the actuator head 7 via the conical region 42. The region 42 is adjoined by a region 43 having a first radius of curvature of 1.9 mm, which is adjoined by a region 44 having a second radius of curvature of 1.5 mm, which is adjoined in turn by a region 45 having a third radius of curvature of 1.0 mm. The region 45 having the third radius of curvature is adjoined in turn by a cylindrical region 46 of plane cross section, by way of which the diaphragm 41 is welded to the bush 9. The region 46 of the diaphragm 41, which has a height d2 of 0.7 mm, protrudes past the bush 9 by 0.3 mm. The region 45 having the third radius of curvature extends as far as a diaphragm height of 1.5 mm; the region 44 having the second radius of curvature passes through the apex of the diaphragm 41 at a height d4 of 1.8 mm and ends at a height d5 of 1.78 mm. The region 43 having the first radius of curvature extends from a diaphragm height of 1.25 mm to a diaphragm height of 1.78 mm.

The outer diameter of the diaphragm 41 is 9.85 mm, and the inner diameter of the diaphragm 41 is 3.7 mm.

The diaphragm shown in FIGS. 5 and 6 is installed in such a way that first the actuator head 7 is welded in load-free fashion to the region 42 of the diaphragm 41. To adjust the mean tension level, the actuator head 7, with a preload of 750 N, which corresponds to an actuator travel of 19 μm, can be pressed onto the piezoelectric component 6, and the region 46 of the diaphragm 41 is welded at this preload to the bush 9.

Alternatively, the region 46 of the diaphragm 41 can be intentionally deformed and pressed into the bush 9 and only then welded to the bush 9.

By exerting the prestressing in the installation of the diaphragm, the tension level at the operating point can be lowered markedly.

Figure 7:
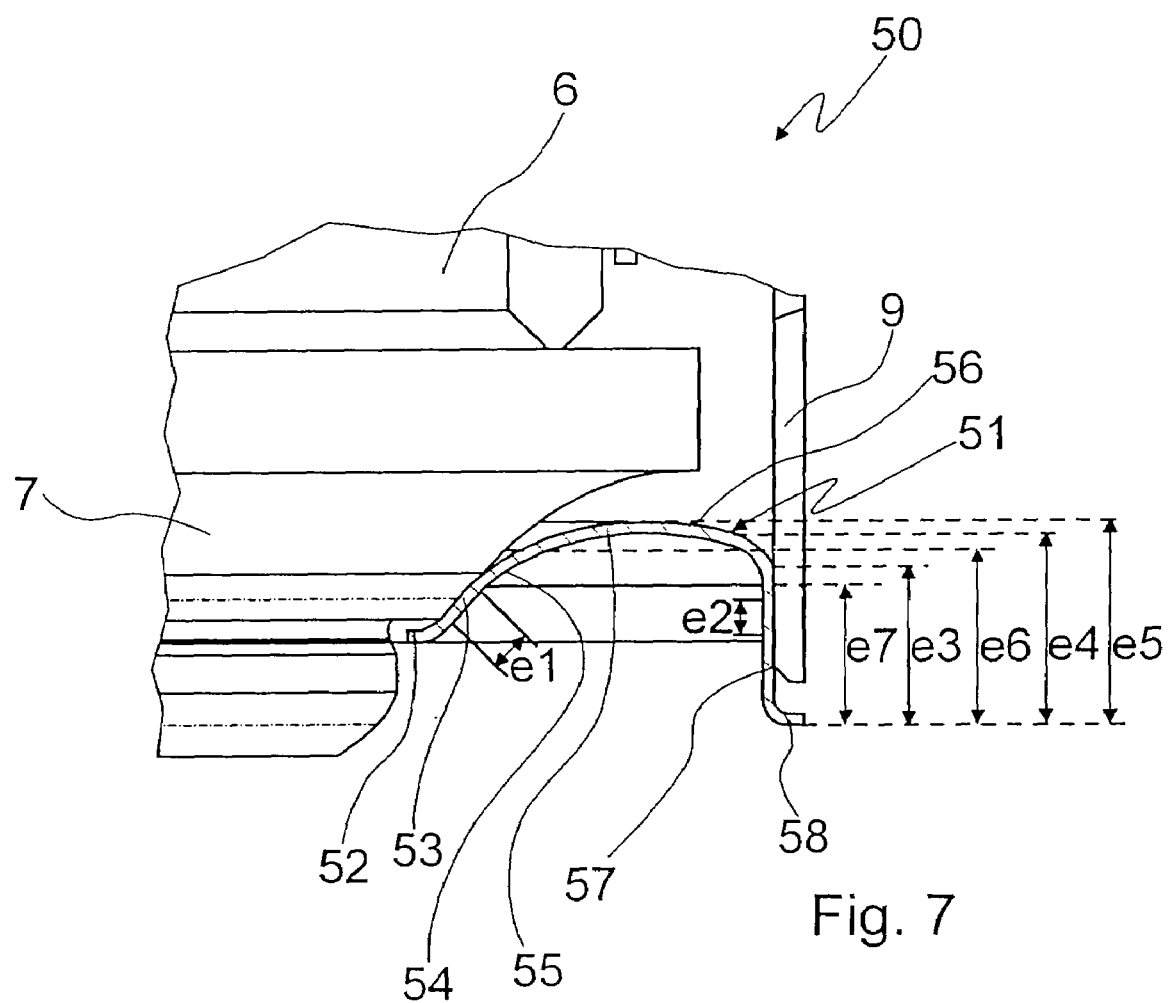
FIG. 7, a fifth embodiment, in a view corresponding to FIG. 6.

In FIG. 7, a fifth embodiment of a piezoelectric actuator module 50 of the invention is shown. The structure of the actuator module 50 is essentially equivalent to that of the actuator module of FIGS. 5 and 6, but differs from that in having a diaphragm 51 of different geometry.

The diaphragm 51 is embodied as curved in the direction of the piezoelectric component 6 and has a cross section which is formed by an annular region 52, oriented perpendicular to the axis of the piezoelectric component 6 and adjoining the actuator foot, and this region is adjoined by a conical region 53, in which the diaphragm 51, over a length e1 of approximately 0.3 mm, is welded to the actuator head 7. The conical region 53 is adjoined by a region 54 having a first radius of curvature of 1.4 mm, which is adjoined by a region 55 having a second radius of curvature of 2.47 mm, which is adjoined in turn by a region 56 having a third radius of curvature of 0.5 mm. The region 56 having the third radius of curvature is adjoined in turn by a cylindrical region 57 of plane cross section, over which the diaphragm 51 is welded to the bush 9 over a length e2 of approximately 0.3 mm. The cylindrical region 57 is defined by an apron-like region 58 oriented perpendicular to the axis of the piezoelectric component 6. The cylindrical region 57 has a height e3 of 1.2 mm and protrudes past the bush 9. The region 56 having the third radius of curvature extends as far as a diaphragm height e4 of 1.75 mm; the region 55 having the second radius of curvature passes through the apex of the diaphragm 51 at a height e5 of 1.85 mm and ends at a height e6 of 1.62 mm. The region 54 having the first radius of curvature extends from a diaphragm height of 1.24 mm to a diaphragm height e7 of 1.66 mm.

The outer diameter of the diaphragm 51 is 10.35 mm in the apron-like region 58 and 9.89 mm in the cylindrical region 57. The inner diameter of the diaphragm 51 is 3.5 mm.

Although the described use of the piezoelectric actuator module of the invention in a fuel injection valve is highly advantageous, the use of a piezoelectric actuator module designed according to the invention is also conceivable in other kinds of application, particularly in those in which a piezoelectric component must be protected against dirt or an aggressive medium.

The foregoing relates to preferred exemplary embodiments of the invention, it being understood that other variants and embodiments thereof are possible within the spirit and scope of the invention, the latter being defined by the appended claims.

The invention claimed is:

1. A piezoelectric actuator module, comprising
at least one piezoelectric component (6), one actuator foot (5), and one actuator head (7) which head includes a conical portion, (42) and cooperates with a component to be actuated by the piezoelectric component (6),
a bush (9) extending in the axial direction and surrounding the actuator module (2; 20; 30), and
a diaphragm (10; 21; 31; 41) extending essentially in the radial direction and adjoining the actuator head (7), the diaphragm being connected to the conical portion,
the diaphragm (10; 21; 31; 41) also being joined to the bush (9) and having a curved cross section in the radial direction.

2. The piezoelectric actuator module of claim 1, wherein the diaphragm (10; 21; 31; 41) is welded to the actuator head (7).

3. The piezoelectric actuator module of claim 1, wherein the diaphragm (10; 21; 41) is welded to the bush (9).

4. The piezoelectric actuator module of claim 2, wherein the diaphragm (10; 21; 41) is welded to the bush (9).

5. The piezoelectric actuator module of claim 1, wherein the diaphragm (31) is manufactured integrally with the bush (9).

6. The piezoelectric actuator module of claim 2, wherein the diaphragm (31) is manufactured integrally with the bush (9).

7. The piezoelectric actuator module of claim 1, wherein the curved cross section of the diaphragm has different radii of curvature.

8. The piezoelectric actuator module of claim 2, wherein the curved cross section of the diaphragm has different radii of curvature.

9. The piezoelectric actuator module of claim 5, wherein the curved cross section of the diaphragm has different radii of curvature.

10. The piezoelectric actuator module of claim 1, wherein the diaphragm (10; 21; 31; 41) has a thickness of between approximately 70 μm and 200 μm.

11. The piezoelectric actuator module of claim 2, wherein the diaphragm (10; 21; 31; 41) has a thickness of between approximately 70 μm and 200 μm.

12. The piezoelectric actuator module of claim 3, wherein the diaphragm (10; 21; 31; 41) has a thickness of between approximately 70 μm and 200 μm.

13. The piezoelectric actuator module of claim 5, wherein the diaphragm (10; 21; 31; 41) has a thickness of between approximately 70 μm and 200 μm.

14. The piezoelectric actuator module of claim 6, wherein the diaphragm (10; 21; 31; 41) has a thickness of between approximately 70 μm and 200 μm.

15. The piezoelectric actuator module of claim 7, wherein the diaphragm (10; 21; 31; 41) has a thickness of between approximately 70 μm and 200 μm.

16. The piezoelectric actuator module of claim 1, installed as a triggering unit of a fuel injection valve (1) of a motor vehicle.

17. A method for installing a piezoelectric actuator module, which includes at least one piezoelectric component (6), one actuator foot (5) and one actuator head (7), which head has a conical portion (42) and cooperates with a component to be actuated by the piezoelectric component (6), and the actuator module (2; 20; 30; 40) is surrounded by a bush (9) extending in the axial direction, the method comprising closing the bush on its face end, on the side toward the actuator head (7), by means of a diaphragm (10; 21; 31; 41) which is secured to the conical portion (42), and which extends essentially in the radial direction.

18. The method of claim 17, further comprising welding the diaphragm (41) and the actuator head (7) together in load-free fashion.

19. The method of claim 18, further comprising introducing the actuator head (7), which has been welded to the diaphragm (41), into the bush (9), and subjecting the actuator head to a preload in the direction of the piezoelectric component (6).

20. The method of claim 19, further comprising welding the diaphragm (41) to the bush (9) with the actuator head (7) preloaded.

* * * * *